United States Patent
Chang

(10) Patent No.: US 7,745,241 B2
(45) Date of Patent: Jun. 29, 2010

(54) METHOD OF MAKING LIGHT EMITTING DIODES

(75) Inventor: Chia-Shou Chang, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/331,388

(22) Filed: Dec. 9, 2008

(65) Prior Publication Data

US 2009/0305443 A1 Dec. 10, 2009

(30) Foreign Application Priority Data

Jun. 4, 2008 (CN) .......................... 2008 1 0067587

(51) Int. Cl.
*H01L 21/00* (2006.01)
(52) U.S. Cl. .............................. 438/28; 438/22; 438/26; 257/99
(58) Field of Classification Search .................... 438/22, 438/26, 28; 257/99, 100
See application file for complete search history.

(56) References Cited

U.S. PATENT DOCUMENTS

| 7,329,905 | B2 | 2/2008 | Ibbetson et al. | |
|---|---|---|---|---|
| 2001/0000208 | A1* | 4/2001 | Bergeron et al. | 219/388 |
| 2008/0224153 | A1* | 9/2008 | Tomoda | 257/88 |
| 2009/0039762 | A1* | 2/2009 | Park et al. | 313/502 |

* cited by examiner

*Primary Examiner*—Zandra Smith
*Assistant Examiner*—Jamie Niesz
(74) *Attorney, Agent, or Firm*—Frank R. Niranjan

(57) ABSTRACT

A method of making a plurality of light emitting diodes simultaneously includes steps of: a) providing a wafer and a first bonding layer, and adhering the first bonding layer to a bottom side of the wafer; b) cutting the wafer to form a plurality of LED dies on the first bonding layer; c) adhering a second bonding layer on top sides of the plurality of LED dies; d) removing the first bonding layer; e) mounting the second bonding layer with the plurality of LED dies on a base having a plurality of recesses; f) removing the second bonding layer and letting the plurality of LED dies fall into the recesses of the base; g) electrically connecting the LED dies to electric poles in the base; h) encapsulating the LED dies; and i) cutting the base to form the plurality of LEDs.

9 Claims, 9 Drawing Sheets

METHOD OF MAKING LIGHT EMITTING DIODES

BACKGROUND

1. Technical Field

The disclosure generally relates to a method of making light emitting diodes, and particularly to a method of making a plurality of light emitting diodes simultaneously.

2. Description of Related Art

In recent years, light emitting diodes (LEDs) have been widely used in illumination. Typically, an LED device includes a plurality of LEDs. Each LED includes an LED chip arranged in a reflector cup and electrically connected to an external circuit. In addition, the LED chip is packaged to protect it from environmental harm and mechanical damage. However, generally, to form the plurality of LEDs, each LED chip is individually mounted into the reflector cup and then connected to a circuit board through wire bonding, and finally transparent material is filled into the reflector cup to encapsulate the LED chip to form an LED. In other words, the LEDs are formed separately at a time, which is costly, time-consuming and may require substantial amounts of manual labor and/or specialized equipment.

For the foregoing reasons, therefore, there is a need in the art for a method for making LEDs which overcomes the limitations described.

DETAILED DESCRIPTION OF THE EMBODIMENTS

Figure 1:
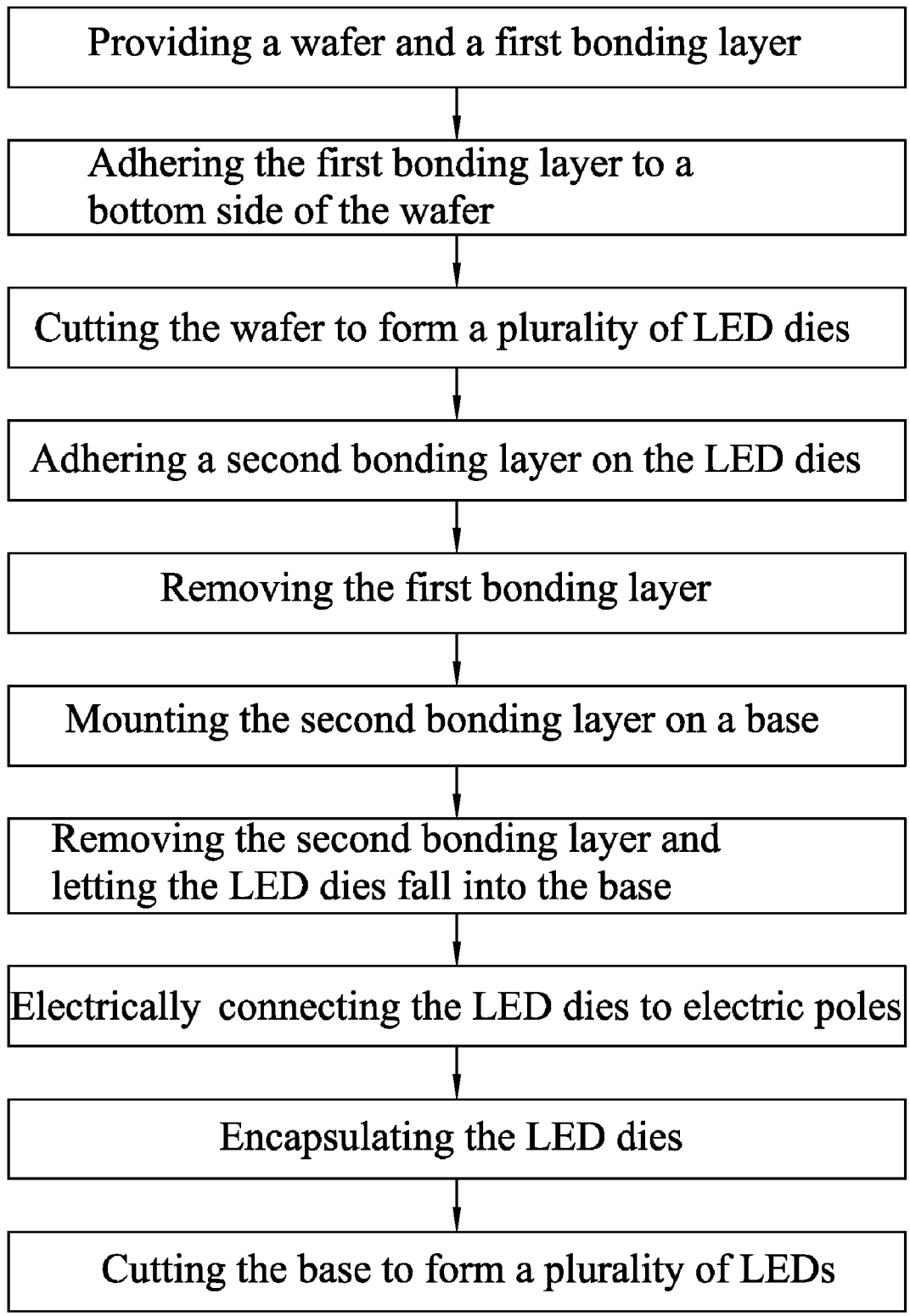
FIG. 1 is a flow chart of a method for making a plurality of light emitting diodes simultaneously according to an exemplary embodiment.

Referring to FIG. 1, a flow chart of a method for making a plurality of light emitting diodes (LEDs) at the same time according to an exemplary embodiment is shown. The method mainly includes steps of: a) adhering a first bonding layer to a bottom side of a wafer; b) cutting the wafer to form a plurality of LED dies on the first bonding layer; c) adhering a second bonding layer on top sides of the plurality of LED dies; d) removing the first bonding layer; e) mounting the second bonding layer with the plurality of LED dies on a base having a plurality of recesses; f) removing the second bonding layer and letting the plurality of LED dies fall into the recesses of the base; g) electrically connecting the LED dies to electric poles; h) encapsulating the LED dies; and i) cutting the base to form the plurality of LEDs.

Figure 2:
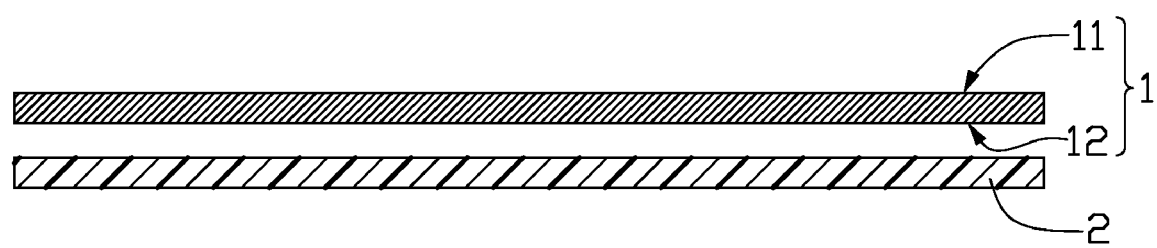
FIG. 2 is a cross section view showing a first bonding layer to be adhered to a wafer.

Referring to FIG. 2, firstly, a wafer 1 is provided. The wafer 1 is formed by growing an epitaxial layer on a substrate. The substrate is sapphire, and the epitaxial layer is gallium arsenide, gallium arsenide phosphide or aluminum gallium arsenide. The epitaxial layer forms a p-n junction structure. The wafer 1 includes a top side 11 formed by the epitaxial layer and a bottom side 12 formed by the substrate. A first bonding layer 2 is adhered to the bottom side 12 of the wafer 1. The first bonding layer 2, which, for example, is an ultraviolet tape or a thermal separation tape, has a viscosity which can be lowered significantly or even completely when the first bonding layer 2 is under a special processing. For example, the ultraviolet tape can lose its viscosity under irradiation of ultraviolet rays. The thermal separation tape can lose its viscosity under heating.

Figure 3:
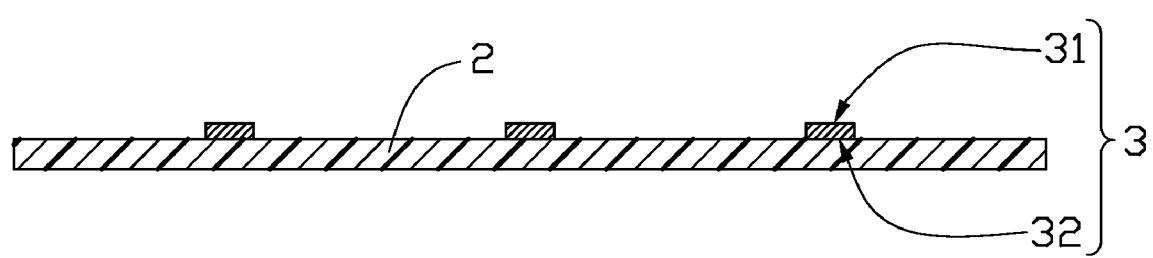
FIG. 3 is a cross section view showing a plurality of LED dies formed on the first bonding layer through cutting the wafer.
Figure 4:
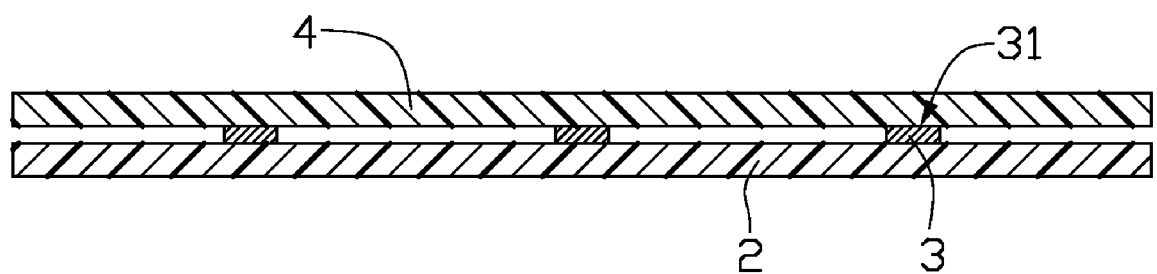
FIG. 4 is a cross section view showing a second bonding layer attached to top sides of the LED dies.

Referring to FIG. 3, the wafer 1 on the first bonding layer 2 is cut to form a plurality of LED dies 3 on the first bonding layer 2. Each LED die 3 includes a p-n junction. The LED dies 3 are substantially evenly spaced from each other. Referring to FIG. 4, a second bonding layer 4 is then arranged on the LED dies 3, and adheres to a top side 31 of each LED die 3. Similar to the first bonding layer 2, the second bonding layer 4 has a viscosity which can be lowered significantly or even completely when the second bonding layer 4 is under a specific processing. For example, the second bonding layer 4 can be an ultraviolet tape or a thermal separation tape. Thus the LED dies 3 are arranged between the first bonding layer 2 and the second bonding layer 4 with top sides 31 thereof adhered to the second bonding layer 4 and bottom sides 32 thereof adhered to the first bonding layer 2.

Figure 5:
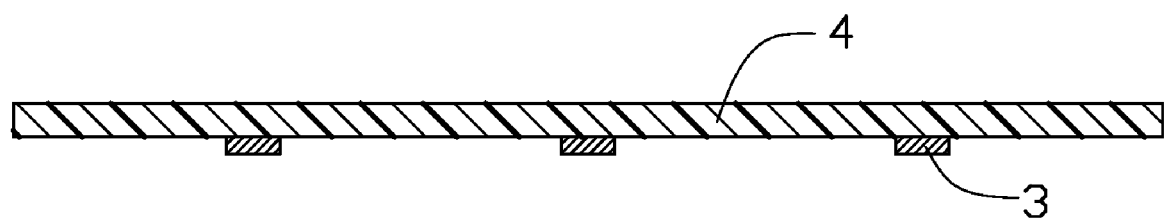
FIG. 5 is a cross section view showing the first bonding layer being removed.

Referring to FIG. 5, the first bonding layer 2 at the bottom sides 32 of the LED dies 3 is then removed. The method for removing the first bonding layer 2 should be changed according to the type of the first bonding layer 2. As the first bonding layer 2 is an ultraviolet tape, ultraviolet rays are used to irradiate the first bonding layer 2 to cause the first bonding layer 2 to lose its viscosity. Alternatively, as the first bonding layer 2 is a thermal separation tape, the first bonding layer 2 is heated to cause the first bonding layer 2 to lose its viscosity. When the first bonding layer 2 loses its viscosity, the first bonding layer 2 can be taken away from the LED dies 3 easily. Thus the LED dies 3 are only bonded to the second bonding layer 4 by the top sides 31 thereof, and the bottom side 32 of the each LED die 3 is exposed.

Figure 6:
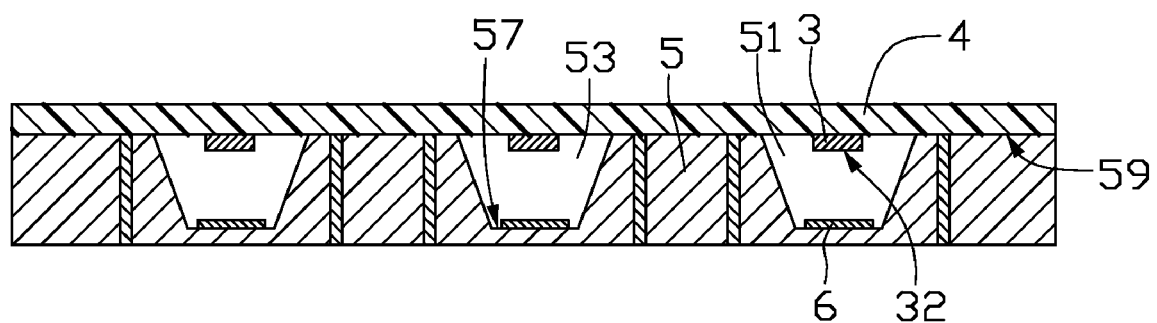
FIG. 6 is a cross section view showing the second bonding layer with the LED dies mounted on a base having a plurality of recesses.
Figure 7:
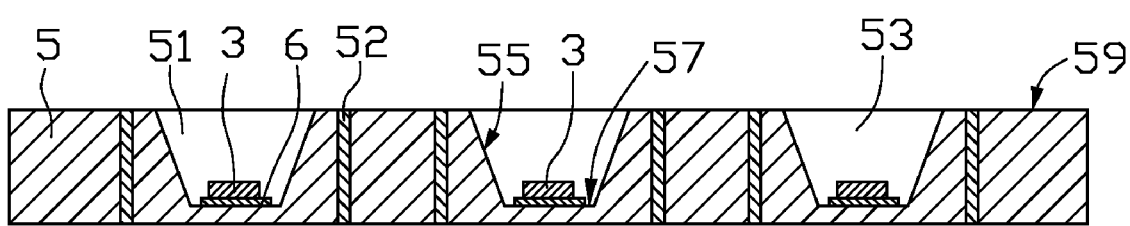
FIG. 7 is a cross section view showing the second bonding layer being removed and thus the LED dies falling into the recesses of the base.

Referring to FIGS. 6 and 7, a base 5 is then provided with a plurality of recesses 51 defined therein for receiving the LED dies 3. The amount and position of the recesses 51 are decided according to the amount and position of the LED dies 3. Each recess 51 is depressed from a top surface 59 of the base 5. A depth of the recess 51 is less than a height of the base 5. Thus the base 5 forms an opening 53 at the top surface 59 thereof, a mounting wall 57 at a bottom of the recess 51, and a reflecting sidewall 55 surrounding the recess 51. The recess 51 is inversely truncated conical and converges downwardly along an axial direction thereof, and thus the reflecting sidewall 55 of the base 5 expands from the mounting wall 57 to the top surface 59 of the base 5. A layer of material of high reflectivity, such as mercury, can be coated on the reflecting sidewall 55 of the base 5. A pair of through holes (not labeled) are defined in the base 5 near each recess 51. An electric pole 52 is received in each of the through holes.

The second bonding layer 4 is then arranged on the top surface 59 of the base 5. Each LED die 3 with the top side 31 thereof adhered to the second bonding layer 4 is thus located in a top of a corresponding recess 51 of the base 5 near the opening 53. Then the second bonding layer 4 is treated to lose its viscosity, and thus the LED dies 3 fall off from the second bonding layer 4 into the recesses 51. When the second bonding layer 4 is an ultraviolet tape, ultraviolet rays are used to irradiate the second bonding layer 4 whereby the second bonding layer 4 loses its viscosity, and when the second bonding layer 4 is a thermal separation tape, the second bonding layer 4 is heated to thereby lose its viscosity. During heating the second bonding layer 4, a heat spreader (not shown) can be arranged on the second bonding layer 4 to obtain a substantially uniform heating of the second bonding layer 4. Thus all of the LED dies 3 can fall into the recesses 51 of the base 5 substantially at the same time. A combination layer 6 is coated on each of the mounting walls 57 of the base 5, and thus when the LED dies 3 fall into the recesses 51, the bottom side 32 of each LED die 3 adheres to the combination layer 6 to avoid movement of the LED die 3 in the recess 51. The combination layer 6 can be either a solder paste or a UV curing adhesive. When the combination layer 6 is a solder paste, then the LED dies 3 are securely fixed to the mounting walls 57 of the base 5 by heating the combination layer 6 in a reflow oven, which can be an infrared oven. If the combination layer 6 is a UV curing adhesive, then the LED dies 3 are securely fixed to the mounting walls 57 of the base 5 by subjecting the combination layer 6 to a UV light irradiation.

Figure 8:
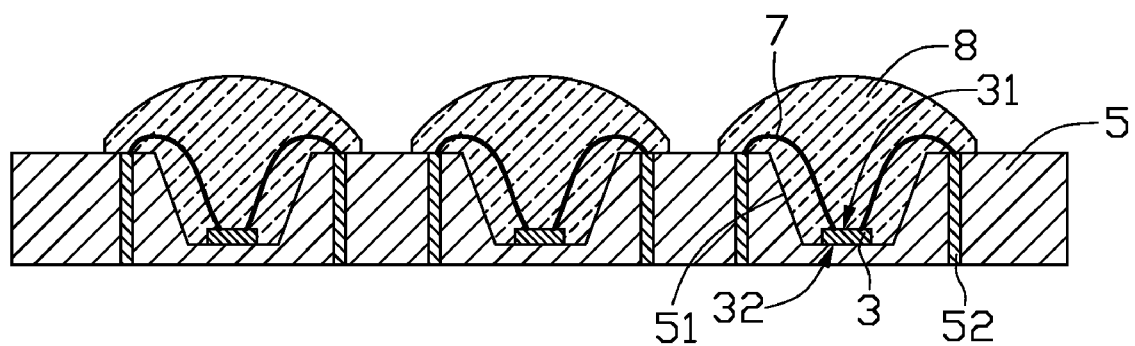
FIG. 8 is a cross section view showing the LED dies being encapsulated.
Figure 9:
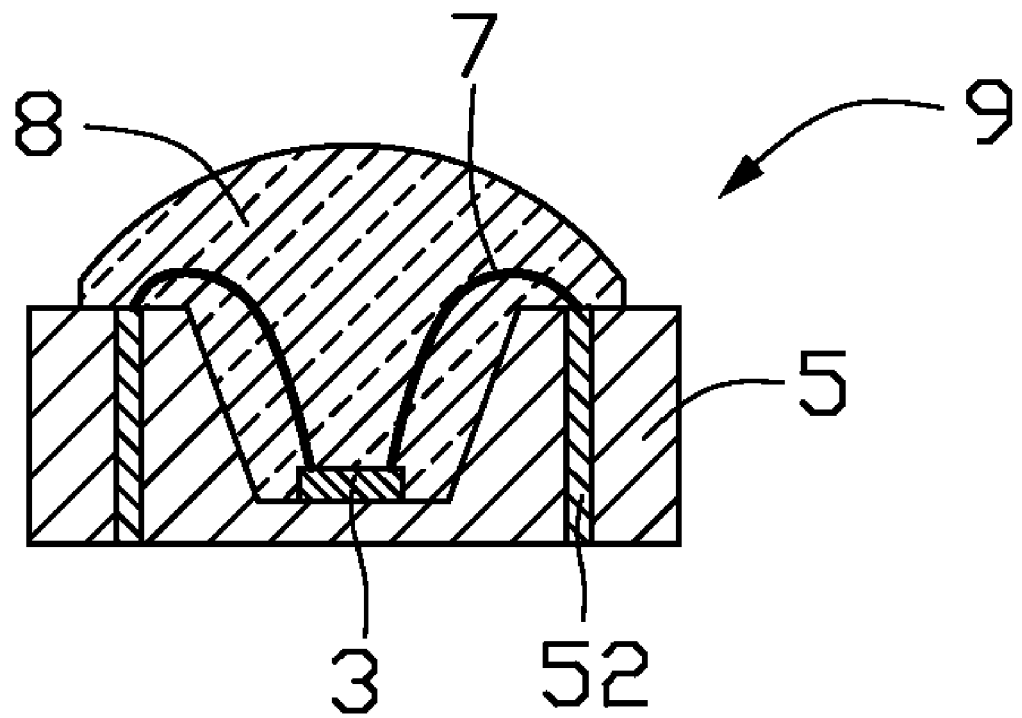
FIG. 9 is a cross section view showing one of a plurality of LEDs formed by cutting the base.

Referring to FIG. 8, after the LED dies 3 are fixed on the mounting walls 57 of the base 5, each of the LED dies 3 is electrically connected to the electric poles 52 near the corresponding recess 51 through wire bonding, in which a pair of gold threads 7 interconnect the electric poles 52 and the LED die 3. Accordingly, the wire bonding process of all of the LED dies 3 can be done at the same time. Transparent material, such as glass and resin, is then filled into the recesses 51 of the base 5 to form a packaging layer 8 to encapsulate each of the LED dies 3. As the LED dies 3 can be mounted into the recesses 51 of the base 5 simultaneously, each of the wire bonding process and the encapsulation process of the plurality of LED dies 3 can be done simultaneously, too. Finally, referring to FIG. 9, the base 5 is cut at positions between two neighboring recesses 51 to form a plurality of LEDs 9. Thus the plurality of LEDs 9 can be formed at the same time, and production efficiency of the LEDs 9 is improved, and correspondingly a cost for producing the LEDs 9 is reduced.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method of making a plurality of light emitting diodes simultaneously, comprising steps of:
    providing a wafer and a first bonding layer;
    adhering the first bonding layer to a bottom side of the wafer;
    cutting the wafer to form a plurality of LED dies on the first bonding layer;
    adhering a second bonding layer on top sides of the plurality of LED dies;
    removing the first bonding layer;
    mounting the second bonding layer with the plurality of LED dies on a base having a plurality of recesses, in which the second bonding layer attaches a top surface of the base, and the LED dies are received in tops of the recesses, respectively;
    treating the second bonding layer to cause the second bonding layer to lose its viscosity and letting the plurality of LED dies fall into bottoms of the recesses of the base, respectively, in which the LED dies are entirely received in the recesses with the top sides thereof lower than the top surface of the base;
    electrically connecting both electrodes of each of the LED dies to electric poles in the base;
    filling transparent material into the recesses to encapsulate the LED dies; and
    cutting the base to form the plurality of light emitting diodes.

2. The method of claim 1, wherein each recess is depressed from the top surface of the base with a depth less than a height of the base, corresponding to the each recess the base defining an opening at the top surface of the base, forming a mounting wall at the bottom of the each recess, and a reflecting sidewall surrounding the each recess, each of the LED dies being fixed to a corresponding one of the mounting walls of the base through one of heating a solder paste and irradiating a UV curing adhesive.

3. The method of claim 2, wherein before fixing the each of the LED dies to the corresponding one of the mounting walls, a combination layer made of one of the solder paste and the UV curing adhesive is coated on the corresponding one of the mounting walls to adhere a corresponding LED die to avoid movement of the corresponding LED die after the LED dies fall into the bottoms of the recesses, respectively.

4. The method of claim 2, wherein each recess is inversely truncated conical and converges downwardly along an axial direction thereof, and the reflecting sidewall of the base expands from the mounting wall to the top surface of the base.

5. The method of claim 1, wherein the step of removing the first bonding layer comprises treating the first bonding layer to cause the first bonding layer to lose its viscosity.

6. The method of claim 5, wherein the first bonding layer is one of a ultraviolet tape and a thermal separation tape, a viscosity of the ultraviolet tape is lost when the ultraviolet tape is under irradiation of ultraviolet rays, and a viscosity of the thermal separation tape is lost when the thermal separation tape is under heating.

7. The method of claim 1, wherein the second bonding layer is one of a ultraviolet tape and a thermal separation tape, a viscosity of the ultraviolet tape is lost when the ultraviolet tape is under irradiation of ultraviolet rays, a viscosity of the thermal separation tape is lost when the thermal separation tape is under heating.

8. The method of claim 7, wherein the second bonding layer is thermal separation tape, and a heat spreader is arranged on the second bonding layer to achieve a substantially uniform heating of the second bonding layer when the second bonding layer is under heating.

9. The method of claim 1, wherein the base defines a pair of through holes near each recess, the electric poles are respectively received in the through holes, and the LED die is electrically connected to a corresponding pair of the electric poles received in the pair of through holes through wire bonding.

* * * * *